(12) United States Patent
Mori

(10) Patent No.: US 10,197,420 B2
(45) Date of Patent: Feb. 5, 2019

(54) MAGNETIC SENSOR CIRCUIT

(71) Applicant: ABLIC Inc., Chiba-shi, Chiba (JP)

(72) Inventor: Ryosuke Mori, Chiba (JP)

(73) Assignee: ABLIC INC., Chiba (JP)

( * ) Notice: Subject to any disclaimer, the term of this patent is extended or adjusted under 35 U.S.C. 154(b) by 0 days.

(21) Appl. No.: 15/885,093

(22) Filed: Jan. 31, 2018

(65) Prior Publication Data
US 2018/0231396 A1    Aug. 16, 2018

(30) Foreign Application Priority Data

Feb. 15, 2017    (JP) ................. 2017-025887

(51) Int. Cl.
| | |
|---|---|
| *G01D 5/14* | (2006.01) |
| *G01R 33/00* | (2006.01) |
| *H03K 17/95* | (2006.01) |
| *H02K 11/215* | (2016.01) |
| *G01R 33/07* | (2006.01) |
| *H01L 43/06* | (2006.01) |

(52) U.S. Cl.
CPC ......... *G01D 5/145* (2013.01); *G01R 33/0029* (2013.01); *G01R 33/07* (2013.01); *H02K 11/215* (2016.01); *H03K 17/9502* (2013.01); *H03K 17/9517* (2013.01); *H01L 43/06* (2013.01)

(58) Field of Classification Search
CPC . G01R 33/07; G01R 33/0029; H03K 17/9502
See application file for complete search history.

(56) References Cited

U.S. PATENT DOCUMENTS

| | | | |
|---|---|---|---|
| 2014/0232387 A1* | 8/2014 | Muraoka ................ | G01D 5/145 324/251 |
| 2014/0232388 A1 | 8/2014 | Muraoka et al. | |
| 2016/0259017 A1* | 9/2016 | Iriguchi ............. | G01R 33/0088 |
| 2017/0234910 A1* | 8/2017 | Nakamura ........... | G01R 15/202 324/251 |

FOREIGN PATENT DOCUMENTS

JP    2014-163692 A1    9/2014

* cited by examiner

*Primary Examiner* — Jermele M Hollington
*Assistant Examiner* — Alvaro Fortich
(74) *Attorney, Agent, or Firm* — Brinks Gilson & Lione

(57) ABSTRACT

A magnetic sensor circuit includes: a first Hall element configured to output a first signal and a second signal; a second Hall element configured to output a third signal and a fourth signal; a signal switching unit configured to select signals among the first to the fourth signal to provide at least two different types of signals as first output signals, by selecting signals each having the signal component having the opposite phase when the offset components each have the same phase, and by selecting signals each having the signal component having the same phase when the offset components each have the opposite phase; and a signal processing unit configured to output second output signals in which the respective offset components of the first output signals are reduced.

3 Claims, 8 Drawing Sheets

MAGNETIC SENSOR CIRCUIT

RELATED APPLICATIONS

This application claims priority under 35 U.S.C. § 119 to Japanese Patent Application No. 2017-025887 filed on Feb. 15, 2017, the entire content of which is hereby incorporated by reference.

BACKGROUND OF THE INVENTION

1. Field of the Invention

The present invention relates to a magnetic sensor circuit.

2. Description of the Related Art

A magnetic sensor circuit has been used as an open/close state detection sensor for a flip cell phone, a notebook computer, or other devices, or a rotation position detection sensor for a motor.

The magnetic sensor circuit includes a magnetoelectric conversion element (Hall element, for example) and a signal processing circuit. The magnetoelectric conversion element outputs a voltage signal having a magnitude determined in relation to the intensity of a magnetic field applied thereto, or the density of a magnetic flux applied thereto. The voltage signal output from the magnetoelectric conversion element is a signal having a minute voltage. The signal processing circuit amplifies the voltage signal output from the magnetoelectric conversion element with an amplifier included in the signal processing circuit.

A voltage signal output from the magnetic sensor circuit has an offset voltage generated in the magnetoelectric conversion element and the signal processing circuit. Due to the offset voltage, a voltage that is not 0 V is output from the magnetic sensor circuit even in a zero magnetic field state, in which no magnetic field is applied. A voltage output from the magnetic sensor circuit also has an error caused by noise. The noise is generated by, among others, the offset voltage described above, flicker noise originating from a single transistor being a constituent of the circuit, and thermal noise originating from the single transistor and a resistor element.

There has been known a magnetic sensor circuit capable of reducing the influence of the offset voltage of the magnetoelectric conversion element and amplifier described above (see Japanese Patent Application Laid-open No. 2014-163692, for example). The magnetic sensor circuit of the related art is illustrated in FIG. 8. A magnetic sensor circuit 8100 includes a Hall element 81a, a Hall element 81b, and a signal processing circuit 83. The signal processing circuit 83 includes a differential amplifier 84a, a differential amplifier 84b, and a calculation unit 86. The differential amplifier 84a and the differential amplifier 84b operate as fully differential amplifiers. The calculation unit 86 operates as an adder.

The magnetic sensor circuit 8100 supplies signals output from the Hall element 81a to different input terminals of the differential amplifier 84a. The magnetic sensor circuit 8100 supplies signals output from the Hall element 81b to different input terminals of the differential amplifier 84b.

The magnetic sensor circuit 8100 outputs signals amplified by the differential amplifier 84a and signals amplified by the differential amplifier 84b to the calculation unit 86. The calculation unit 86 reduces offset voltages, which are contained in the signals output from the Hall element 81a and the signals output from the Hall element 81b, by adding the respective signals output from the differential amplifier 84a and the signals output from the differential amplifier 84b.

However, the differential amplifier 84a and the differential amplifier 84b included in the magnetic sensor circuit 8100 of the related art are desirably built from bipolar transistors. A comparison between a case in which the differential amplifier 84a and the differential amplifier 84b are built from bipolar transistors and a case in which the differential amplifiers 84a and 84b are built by a complementary metal oxide semiconductor (CMOS) process reveals that an input offset voltage is higher when the CMOS process is used. Flicker noise and other types of noise are also generated when the CMOS process is used.

In other words, when the differential amplifier 84a and the differential amplifier 84b are built by a CMOS process, noise degrades the quality of voltage signals output from the magnetoelectric conversion elements, which have a minute voltage.

SUMMARY OF THE INVENTION

It is therefore an object of the present invention to provide a magnetic sensor circuit capable of reducing flicker noise and other types of noise.

In order to solve such a problem of the related art, a magnetic sensor circuit according to one embodiment of the present invention is configured as follows.

According to one embodiment of the present invention, there is provided a magnetic sensor circuit configured to output a signal according to an intensity of a magnetic field applied to a Hall element, the magnetic sensor circuit including: a first Hall element configured to output a first signal and a second signal each having a signal component of an opposite phase and an offset component of an opposite phase; a second Hall element configured to output a third signal and a fourth signal each having a signal component of an opposite phase and an offset component of an opposite phase, the third signal having the signal component of a same phase with the signal component of the first signal, and having the offset component of an opposite phase with the offset component of the first signal, the fourth signal having the signal component of a same phase with the signal component of the second signal, and having the offset component of an opposite phase with the offset component of the second signal; a signal switching unit configured to select, among the first signal, the second signal, the third signal, and the fourth signal, at least two different signals as first output signals, by selecting signals each having the signal component of the opposite phase when the offset components each have the same phase, and by selecting signals each having the signal component of the same phase when the offset components each have the opposite phase; and a signal processing unit configured to output second output signals in which the offset components of the respective first output signals are reduced by performing calculation between the respective first output signals, which are selected by the signal switching unit.

The magnetic sensor circuit according to the one embodiment of the present invention further includes a second signal switching unit configured to switch destinations to which the second output signals are output, depending on the signal switched by the signal switching unit In the magnetic sensor circuit according to the one embodiment of the present invention, the first Hall element, the second Hall element, the signal switching unit, the signal processing unit, and the second signal switching unit are formed on a same semiconductor substrate.

According to the present invention, it is possible to provide a magnetic sensor circuit capable of reducing flicker noise and other types of noise.

DETAILED DESCRIPTION OF THE EMBODIMENTS

Now, embodiments of the present invention are described with reference to the drawings.

First Embodiment

The configuration of a magnetic sensor circuit according to the first embodiment of the present invention is described with reference to FIG. 1.

Figure 1:
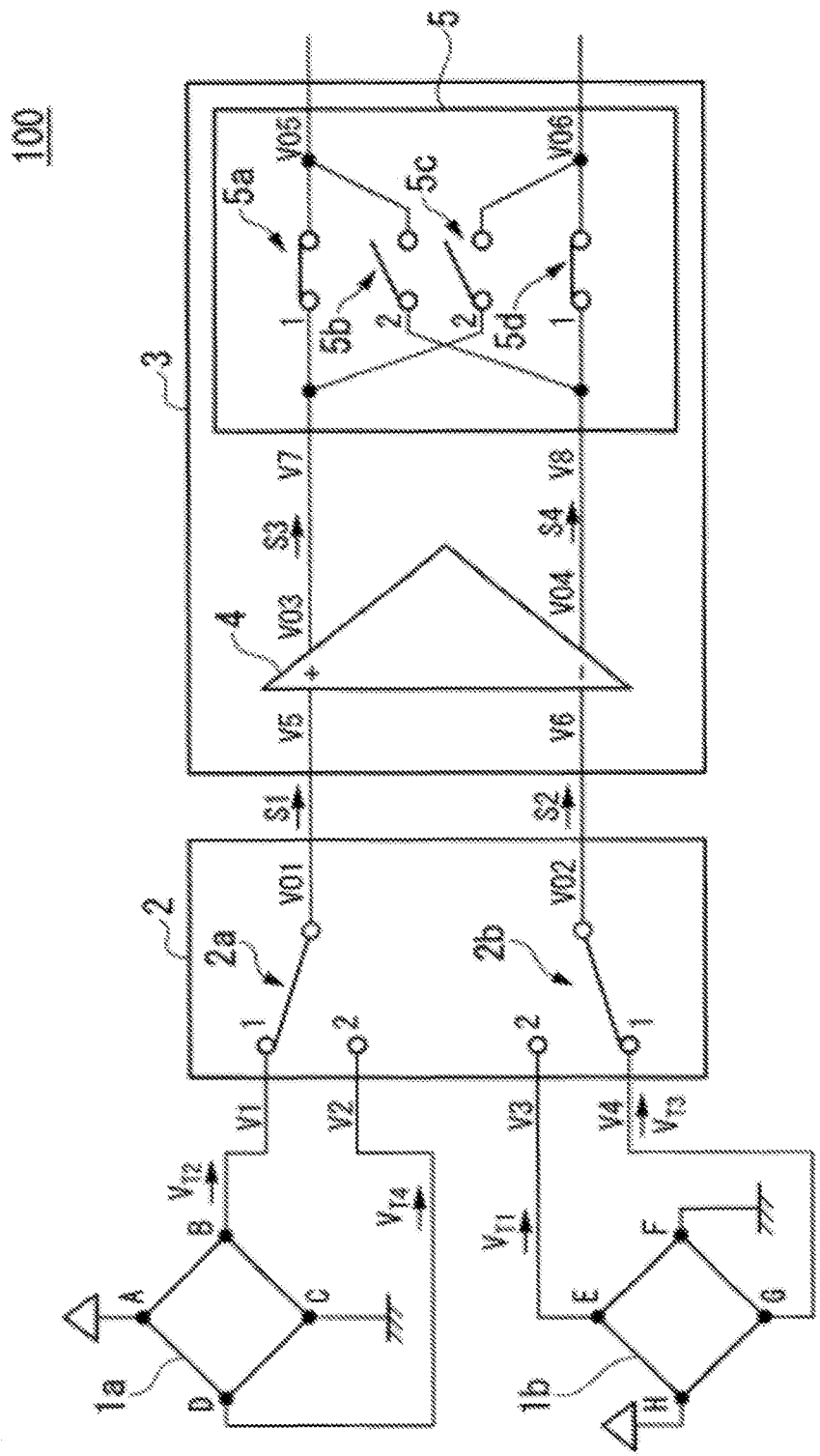
FIG. 1 is a circuit diagram of a magnetic sensor circuit according to a first embodiment of the present invention.

FIG. 1 is a circuit diagram of the magnetic sensor circuit according to the first embodiment.

A magnetic sensor circuit 100 according to the first embodiment includes a Hall element 1a and a Hall element 1b, which are each a magnetoelectric conversion element, a first switch circuit 2, and a signal processing circuit 3. The Hall element 1a is an example of a first Hall element. The Hall element 1b is an example of a second Hall element. The Hall element 1a includes a terminal A, a terminal B, a terminal C, and a terminal D. The Hall element 1b includes a terminal E, a terminal F, a terminal G, and a terminal H. The first switch circuit 2 includes a first switch 2a and a first switch 2b. The first switch circuit 2 is an example of a signal switching unit. The signal processing circuit 3 includes a differential amplifier 4 and a second switch circuit 5. The signal processing circuit 3 is an example of a signal processing unit. The differential amplifier 4 includes an input terminal V5, an input terminal V6, an output terminal VO3, and an output terminal VO4. The second switch circuit 5 includes a second switch 5a, a second switch 5b, a second switch 5c, and a second switch 5d. The second switch circuit 5 is an example of a second signal switching unit.

The Hall element 1a and the Hall element 1b are positioned close to each other. The Hall elements 1a and 1b are arranged so that a straight line connecting the terminal A and terminal C of the Hall element 1a and a straight line connecting the terminal E and terminal G of the Hall element 1b are substantially parallel to each other. The Hall elements 1a and 1b are also arranged so that a straight line connecting the terminal B and terminal D of the Hall element 1a and a straight line connecting the terminal F and terminal H of the Hall element 1b are substantially parallel to each other. When two Hall elements are arranged in this manner, magnetic fields or magnetic fluxes applied to the two elements can have the same intensity or density. This gives the same magnitude of voltage to voltage signals output from the two Hall elements.

A power supply voltage is supplied to the terminal A of the Hall element 1a. A ground voltage is supplied to the terminal C of the Hall element 1a.

The power supply voltage is supplied to the terminal H of the Hall element 1b. The ground voltage is supplied to the terminal F of the Hall element 1b.

The first switch 2a includes an input terminal V1, an input terminal V2, and an output terminal VO1. The input terminal V1 is connected to the terminal B of the Hall element 1a. The input terminal V2 is connected to the terminal D of the Hall element 1a. The output terminal VO1 is connected to the input terminal V5 of the differential amplifier 4.

The first switch 2b includes an input terminal V3, an input terminal V4, and an output terminal VO2. The input terminal V3 is connected to the terminal E of the Hall element 1b. The input terminal V4 is connected to the terminal G of the Hall element 1b. The output terminal VO2 is connected to the input terminal V6 of the differential amplifier 4.

The second switch circuit 5 includes an input terminal V7, an input terminal V8, an output terminal VO5, and an output terminal VO6.

The input terminal V7 is connected to the second switch 5a and the second switch 5c. The second switch 5a is connected to the output terminal VO5. The second switch 5c is connected to the output terminal VO6.

The input terminal V8 is connected to the second switch 5b and the second switch 5d. The second switch 5b is connected to the output terminal VO5. The second switch 5d is connected to the output terminal VO6.

[Outline of the Operation of the Magnetic Sensor Circuit 100]

The operation of the magnetic sensor circuit 100 according to the first embodiment is described next.

The magnetic sensor circuit 100 outputs a signal having a magnitude determined in relation to the intensity of magnetic fields applied to, or the density of magnetic fluxes applied to, the Hall element 1a and the Hall element 1b.

The Hall element 1a and the Hall element 1b output, as Hall element signals, voltage signals each having a magnitude determined in relation to the intensity of a magnetic field applied to, or the density of a magnetic flux applied to, the Hall element. The voltage of each Hall element signal includes a voltage representing a signal component and an offset voltage representing an offset component.

The Hall element signals output from the Hall element 1a and the Hall element 1b are described. The Hall element signals output from the Hall element 1a and the Hall element 1b are expressed by Expression (1) to Expression (4). In Expression (1) to Expression (4), Vsig is the voltage of each signal component output from the Hall element 1a and the Hall element 1b, and Vos is the voltage of each offset component output from the Hall element 1a and the Hall element 1b.

The Hall element 1a outputs from the terminal B a Hall element signal $V_{T2}$, which is expressed by Expression (1). The Hall element signal $V_{T2}$ is an example of a first signal.

$$V_{T2} = +\frac{Vsig}{2} + \frac{Vos}{2} \quad (1)$$

The Hall element 1*a* outputs from the terminal D a Hall element signal $V_{T4}$, which is expressed by Expression (2). The Hall element signal $V_{T4}$ is an example of a second signal.

$$V_{T4} = -\frac{Vsig}{2} - \frac{Vos}{2} \quad (2)$$

In short, the Hall element 1*a* outputs the first signal and the second signal, which are two types of signals each having a signal component having an opposite phase and offset components.

The Hall element 1*b* outputs from the terminal E a Hall element signal $V_{T1}$, which is expressed by Expression (3). The Hall element signal $V_{T1}$ is an example of a third signal. The Hall element signal $V_{T1}$ has a signal component in the same phase as the phase of the signal component of the Hall element signal $V_{T2}$, and an offset component in a phase opposite to the phase of the offset component of the Hall element signal $V_{T2}$.

$$V_{T1} = +\frac{Vsig}{2} - \frac{Vos}{2} \quad (3)$$

The Hall element 1*b* outputs from the terminal G a Hall element signal $V_{T3}$, which is expressed by Expression (4). The Hall element signal $V_{T3}$ is an example of a fourth signal. The Hall element signal $V_{T3}$ has a signal component in the same phase as the phase of the signal component of the Hall element signal $V_{T4}$, and an offset component in a phase opposite to the phase of the offset component of the Hall element signal $V_{T4}$.

$$V_{T3} = -\frac{Vsig}{2} + \frac{Vos}{2} \quad (4)$$

In short, the Hall element 1*b* outputs the third signal and the fourth signal which are two types of signals each having a signal component having an opposite phase and an offset component having an opposite phase.

The first switch circuit 2 is described next.

The first switch circuit 2 selects, as first output signals, at least two signals of types different from each other out of the Hall element signal $V_{T1}$, the Hall element signal $V_{T2}$, the Hall element signal $V_{T3}$, and the Hall element signal $V_{T4}$. One of the selected Hall element signals is output from the output terminal VO1 of the first switch circuit 2 as a signal S1. Another of the selected Hall element signals is output from the output terminal VO2 of the first switch circuit 2 as a signal S2. The first output signals are the signal S1 and signal S2 output from the first switch circuit 2. Specifically, the first switch circuit 2 selects signals each having the signal component of the opposite phase when the respective offset components having the same phase. The first switch circuit 2 selects signals having signal components of the same phase as each other when the respective offset components having the opposite phase.

More specifically, when the first switch 2*a* selects the Hall element signal $V_{T2}$, the first switch 2*b* selects the Hall element signal $V_{T3}$. The state in which the first switch 2*a* selects the Hall element signal $V_{T2}$ and the first switch 2*b* selects the Hall element signal $V_{T3}$ is also referred to as "first phase".

When the first switch 2*a* selects the Hall element signal $V_{T4}$, the first switch 2*b* selects the Hall element signal $V_{T1}$. The state in which the first switch 2*a* selects the Hall element signal $V_{T4}$ and the first switch 2*b* selects the Hall element signal $V_{T1}$ is also referred to as "second phase".

The first switch circuit 2 in this example switches between the first phase and the second phase in response to a signal from an oscillator (not shown). The oscillator outputs a signal having a frequency of several hundred kilohertz. The frequency of the signal output by the oscillator is also referred to as "clock frequency". The first switch circuit 2 switches between the first phase and the second phase alternatingly depending on the clock frequency.

The signal processing circuit 3 performs calculation between the respective first output signals selected by the first switch circuit 2, to thereby output second output signals in which the respective offset components of the first output signals are reduced. Specifically, the differential amplifier 4 calculates a difference between the signal S1 supplied to the input terminal V5 and the signal S2 supplied to the input terminal V6. The differential amplifier 4 outputs a signal S3 from the output terminal VO3. The differential amplifier 4 also outputs a signal S4 from the output terminal VO4. The signal S3 and the signal S4 are differential signals. The second output signals include the signal S3 and the signal S4.

Figure 2A:
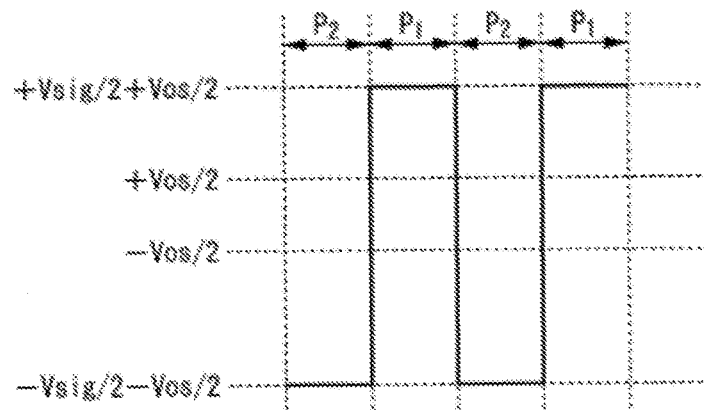
FIG. 2A, FIG. 2B, and FIG. 2C are time charts for illustrating the circuit operation of a differential amplifier of the first embodiment.
Figure 2B:
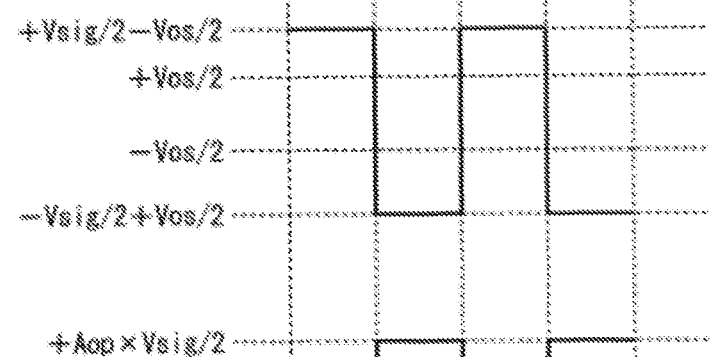
Figure 2C:
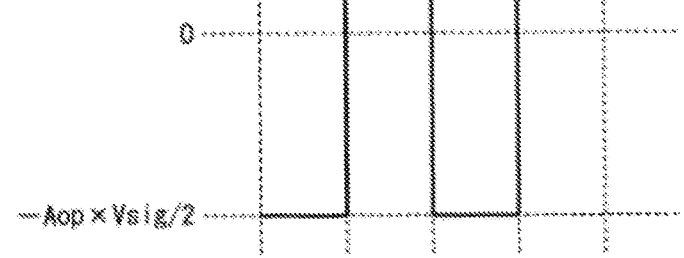

FIG. 2A to FIG. 2C are time charts for illustrating the circuit operation of the differential amplifier 4 of the first embodiment. An example of the first output signals supplied to the differential amplifier 4 and the second output signals output from the differential amplifier 4 is described with reference to FIG. 2A to FIG. 2C.

FIG. 2A is a time chart of the signal S1, which is supplied to the input terminal V5. FIG. 2B is a time chart of the signal S2, which is supplied to the input terminal V6. FIG. 2C is a time chart of the signal S3, which is output from the output terminal VO3.

As illustrated in FIG. 2A to FIG. 2C, in a first phase $P_1$, the Hall element signal $V_{T2}$ expressed by Expression (1) is input to the input terminal V5, and the Hall element signal $V_{T3}$ expressed by Expression (4) is supplied to the input terminal V6. The differential amplifier 4 subtracts the Hall element signal $V_{T3}$ from the Hall element signal $V_{T2}$. Specifically, the differential amplifier 4 inverts the positive/negative sign of the Hall element signal $V_{T3}$. The differential amplifier 4 adds the inverted Hall element signal $V_{T3}$ and the Hall element signal $V_{T2}$. The differential amplifier 4 outputs a voltage signal obtained by the subtraction from the output terminal VO3 as the signal S3.

In a second phase $P_2$, the Hall element signal $V_{T4}$ expressed by Expression (2) is input to the input terminal V5, and the Hall element signal $V_{T1}$ expressed by Expression (3) is supplied to the input terminal V6. The differential amplifier 4 subtracts the Hall element signal $V_{T1}$ from the Hall element signal $V_{T4}$. Specifically, the differential amplifier 4 inverts the positive/negative sign of the Hall element signal $V_{T1}$. The differential amplifier 4 adds the inverted Hall element signal $V_{T1}$ and the Hall element signal $V_{T4}$. The differential amplifier 4 outputs a voltage signal obtained by the subtraction from the output terminal VO3 as the signal S3.

From the output terminal VO4, a signal having a voltage in a phase opposite to the phase of the voltage signal output from the output terminal VO3 is output as the signal S4.

When the first switch circuit 2 is in the first phase $P_1$, the differential amplifier 4 outputs the signal S3 having a voltage of +Aop×Vsig/2 from the output terminal VO3, and outputs the signal S4 having a voltage of −Aop×Vsig/2 from the output terminal VO4. The coefficient Aop is the amplification factor of the differential amplifier 4. When the first switch circuit 2 is in the second phase $P_2$, the differential amplifier 4 outputs the signal S3 having a voltage of −Aop×Vsig/2 from the output terminal VO3, and outputs the signal S4 having a voltage of +Aop×Vsig/2 from the output terminal VO4.

The signal S3 output from the output terminal VO3 is a signal reduced in the offset component Vos. The signal S4 output from the output terminal VO4 is a signal reduced in the offset component Vos.

The circuit operation of the second switch circuit 5 is described next. The second switch circuit 5 switches destinations to which the signal S3 supplied from the input terminal V7 and the signal S4 supplied from the input terminal V8 are output, depending on to which signal type the first switch circuit 2 switches. Specifically, the second switch circuit 5 switches signals for output, in synchronization with the operation performed by the first switch circuit 2 to select signals.

More specifically, when the first switch circuit 2 is in the first phase $P_1$, the second switch circuit 5 puts the second switch 5a and the second switch 5d each in a conducting state. The second switch circuit 5 also puts the second switch 5b and the second switch 5c each in a non-conducting state. In this case, the signal S3 supplied from the input terminal V7 is output from the output terminal VO5, and the signal S4 supplied from the input terminal V8 is output from the output terminal VO6.

When the first switch circuit 2 is in the second phase $P_2$, the second switch circuit 5 puts the second switch 5b and the second switch 5c each in a conducting state. The second switch circuit 5 also puts the second switch 5a and the second switch 5d each in a non-conducting state. In this case, the signal S4 supplied from the input terminal V8 is output from the output terminal VO5, and the signal S3 supplied from the input terminal V7 is output from the output terminal VO6.

The second switch circuit 5 described above is not indispensable. The second switch circuit 5 is a circuit for returning the frequency of a voltage signal amplified by and output from the differential amplifier 4 to the original frequency of the voltage signal. The amplified voltage signal is higher in voltage than the minute voltage signals supplied from the Hall element 1a and the Hall element 1b. The amplified voltage signal is affected by noise less than the voltage signal prior to amplification is. Being less affected by noise, the amplified voltage signal can be processed by various types of signal processing.

To summarize the description given above, the magnetic sensor circuit 100 according to the first embodiment constructs a chopping circuit from the Hall element 1a, the Hall element 1b, and the first switch circuit 2. The first switch circuit 2 selects a combination of Hall element signals with which offset components are reduced. The differential amplifier 4 performs calculation between the respective Hall element signals selected by the first switch circuit 2, to thereby reduce the offset components, which are noise generated from the Hall elements. The chopping circuit also modulates the frequency range of the Hall element signals selected by the first switch circuit 2 to the range of the clock frequency used to switch which Hall element signals are selected by the first switch circuit 2. Flicker noise has a frequency that is low frequency range noise, and can be removed by removing the low frequency range noise. In other words, flicker noise generated from the differential amplifier 4 can be removed by the chopping circuit described above and by a post-filter (not shown). The magnetic sensor circuit 100 capable of reducing flicker noise and other types of noise can be provided in this manner.

The first switch circuit 2 can use switches smaller in size than in a switch circuit used for spinning current of the related art. Spinning current is a technology with which an offset component generated from a Hall element is reduced by switching a terminal through which power is supplied to the Hall element and a terminal through which a Hall element signal output from the Hall element is taken out. A switch for switching the terminal through which power is supplied to the Hall element is larger in size than the first switch circuit 2, which switches Hall element signals. Switching noise generated by switching Hall element signals is smaller than switching noise generated by switching the terminal through which power is supplied. This allows the first switch circuit 2 to use switches smaller in size than in the switch circuit used for spinning current. The first switch circuit 2 can also reduce the level of switching noise from the level in the switch circuit used for spinning current.

While the description given above deals with a case in which the differential amplifier 4 serves as a subtracter, the present invention is not limited thereto. The differential amplifier 4 may serve as an adder instead. When the differential amplifier 4 serves as an adder, the first switch circuit 2 selects a signal having a signal component having the same phase and an offset component having an opposite phase. For example, the first switch circuit 2 selects, as the first phase, the Hall element signal $V_{T2}$ and Hall element signal $V_{T1}$ described above. The first switch circuit 2 selects, as the second phase, the Hall element signal $V_{T4}$ and Hall element signal $V_{T3}$ described above.

The Hall element 1a, the Hall element 1b, the first switch circuit 2, the differential amplifier 4, and the second switch circuit 5 may be formed on the same semiconductor substrate. The semiconductor substrate in this case can be manufactured by the CMOS process. The differential amplifiers 84a and 84b of the related art desirably use bipolar transistors in which no flicker noise is generated, in order to reduce an offset component and flicker noise generated in a CMOS device. However, the use of a bipolar transistor as a differential amplifier makes the process cost of a semiconductor substrate higher and the size of the semiconductor substrate larger than when the CMOS process is used. In other words, the magnetic sensor circuit 100 can separate the frequency range of Hall element signals and the frequency range of flicker noise generated in the differential amplifier 4 by including the chopping circuit, and can be manufactured inexpensively at a smaller semiconductor substrate size owing to the use of the CMOS process in its manufacture.

Second Embodiment

The description up to this point deals with a configuration in which the signal processing circuit includes one differential amplifier. A configuration in which the signal processing circuit includes two differential amplifiers is described next with reference to FIG. 3.

Figure 3:
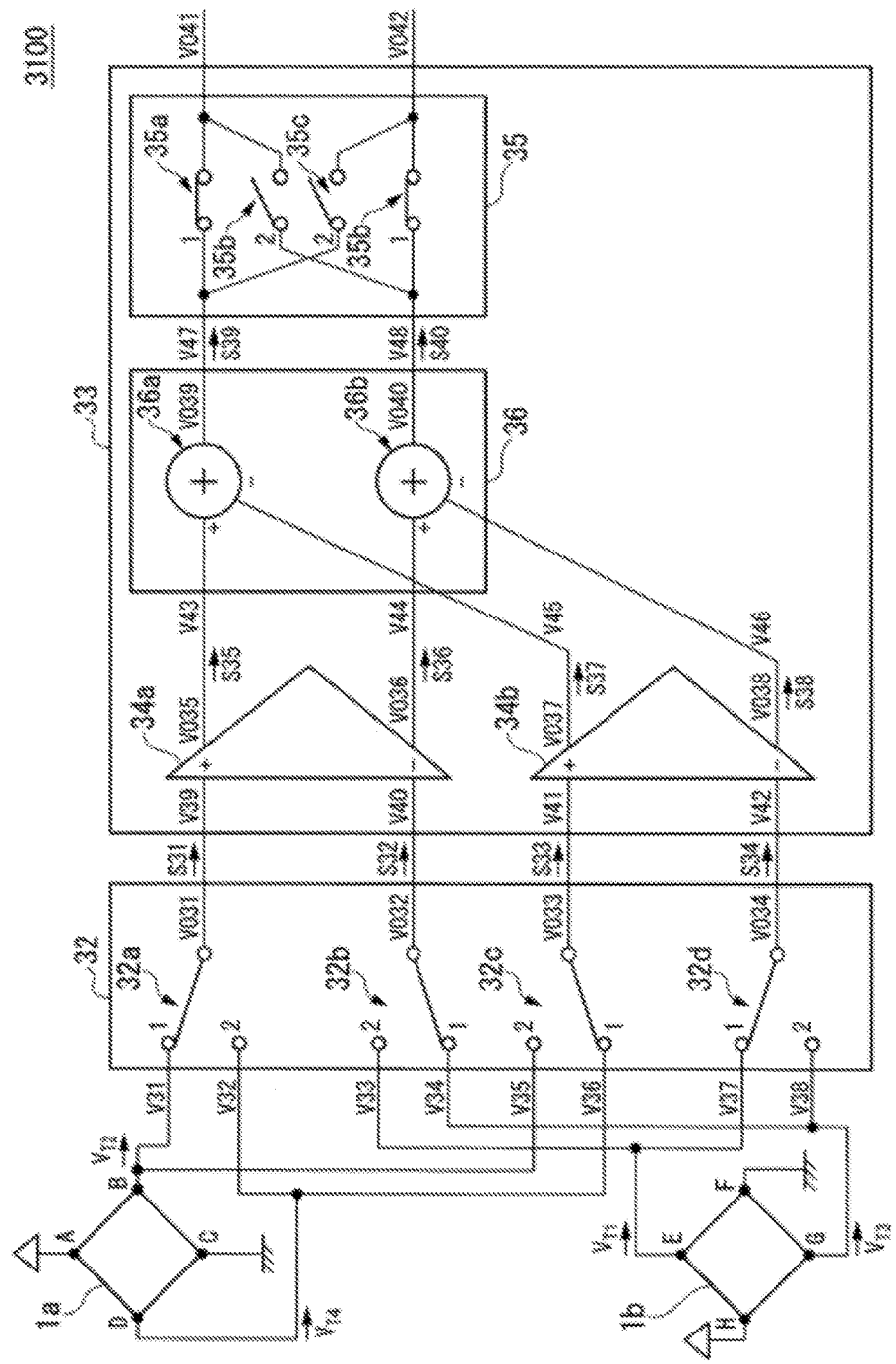
FIG. 3 is a circuit diagram of a magnetic sensor circuit according to a second embodiment of the present invention.

FIG. 3 is a circuit diagram of a magnetic sensor circuit according to the second embodiment. In the second embodiment of the present invention, components and operation, which are the same as those in the first embodiment, are denoted by the same reference symbols, and descriptions on the same components and operation are omitted.

A magnetic sensor circuit 3100 according to the second embodiment includes the Hall element 1a and the Hall element 1b, which are each a magnetoelectric conversion element, a first switch circuit 32, and a signal processing circuit 33. The first switch circuit 32 includes a first switch 32a, a first switch 32b, a first switch 32c, and a first switch 32d. The signal processing circuit 33 includes a differential amplifier 34a, a differential amplifier 34b, a subtracter 36, and a second switch circuit 35.

The differential amplifier 34a includes an input terminal V39, an input terminal V40, an output terminal VO35, and an output terminal VO36.

The differential amplifier 34b includes an input terminal V41, an input terminal V42, an output terminal VO37, and an output terminal VO38.

The subtracter 36 includes an input terminal V43, an input terminal V44, an input terminal V45, an input terminal V46, an output terminal VO39, and an output terminal VO40. The subtracter 36 is an example of the calculation unit used in a calculation of the respective first output signals.

The second switch circuit 35 includes an input terminal V47, an input terminal V48, an output terminal VO41, and an output terminal VO42.

The first switch 32a includes an input terminal V31, an input terminal V32, and an output terminal VO31. The input terminal V31 is connected to the terminal B of the Hall element 1a. The input terminal V32 is connected to the terminal D of the Hall element 1a. The output terminal VO31 is connected to the input terminal V39 of the differential amplifier 34a.

The first switch 32b includes an input terminal V33, an input terminal V34, and an output terminal VO32. The input terminal V33 is connected to the terminal E of the Hall element 1b. The input terminal V34 is connected to the terminal G of the Hall element 1b. The output terminal VO32 is connected to the input terminal V40 of the differential amplifier 34a.

The first switch 32c includes an input terminal V35, an input terminal V36, and an output terminal VO33. The input terminal V35 is connected to the terminal B of the Hall element 1a. The input terminal V36 is connected to the terminal D of the Hall element 1a. The output terminal VO33 is connected to the input terminal V41 of the differential amplifier 34b.

The first switch 32d includes an input terminal V37, an input terminal V38, and an output terminal VO34. The input terminal V37 is connected to the terminal E of the Hall element 1b. The input terminal V38 is connected to the terminal G of the Hall element 1b. The output terminal VO34 is connected to the input terminal V42 of the differential amplifier 34b.

The output terminal VO35 of the differential amplifier 34a is connected to the input terminal V43 of the subtracter 36. The output terminal VO36 of the differential amplifier 34a is connected to the input terminal V44 of the subtracter 36.

The output terminal VO37 of the differential amplifier 34b is connected to the input terminal V45 of the subtracter 36. The output terminal VO38 of the differential amplifier 34b is connected to the input terminal V46 of the subtracter 36.

The output terminal VO39 of the subtracter 36 is connected to the input terminal V47 of the second switch circuit 35.

The output terminal VO40 of the subtracter 36 is connected to the input terminal V48 of the second switch circuit 35.

The input terminal V47 of the second switch circuit 35 is connected to the second switch 35a and the second switch 35c. The second switch 35a is connected to the output terminal VO41. The second switch 35c is connected to the output terminal VO42.

The input terminal V48 is connected to the second switch 35b and the second switch 35d. The second switch 35b is connected to the output terminal VO41. The second switch 35d is connected to the output terminal VO42.

[Outline of the Operation of the Magnetic Sensor Circuit 3100]

The operation of the magnetic sensor circuit 3100 is described next.

The first switch circuit 32 selects Hall element signals supplied by the Hall element 1a and the Hall element 1b. The first switch 32a outputs, as a signal S31, one of the selected Hall element signals. The first switch 32b outputs, as a signal S32, another of the selected Hall element signals. The first switch 32c outputs, as a signal S33, still another of the selected Hall element signals. The first switch 32d outputs, as a signal S34, yet still another of the selected Hall element signals. The first output signals of the second embodiment include the signal S31, the signal S32, the signal S33, and the signal S34.

The first switch circuit 32 switches between two states, namely, the first phase and the second phase, alternatingly as in the first embodiment.

A case in which the first switch circuit 32 is in the first phase is described.

The first switch 32a selects the Hall element signal $V_{T2}$ supplied to the input terminal V31. The first switch 32b selects the Hall element signal $V_{T3}$ supplied to the input terminal V34. The first switch 32c selects the Hall element signal $V_{T4}$ supplied to the input terminal V36. The first switch 32d selects the Hall element signal $V_{T1}$ supplied to the input terminal V37.

A case in which the first switch circuit 32 is in the second phase is described next.

The first switch 32a selects the Hall element signal $V_{T4}$ supplied to the input terminal V32. The first switch 32b selects the Hall element signal $V_{T1}$ supplied to the input terminal V33. The first switch 32c selects the Hall element signal $V_{T2}$ supplied to the input terminal V35. The first switch 32d selects the Hall element signal $V_{T3}$ supplied to the input terminal V38.

The differential amplifier 34a calculates a difference between voltage signals supplied to the input terminal V39 and the input terminal V40. The differential amplifier 34a outputs from the output terminal VO35 and the output terminal VO36 differential signals, which are a voltage signal obtained by the calculation.

The differential amplifier 34b calculates a difference between voltage signals supplied to the input terminal V41 and the input terminal V42. The differential amplifier 34b outputs from the output terminal VO37 and the output terminal VO38 differential signals, which are a voltage signal obtained by the calculation.

Figure 4A:
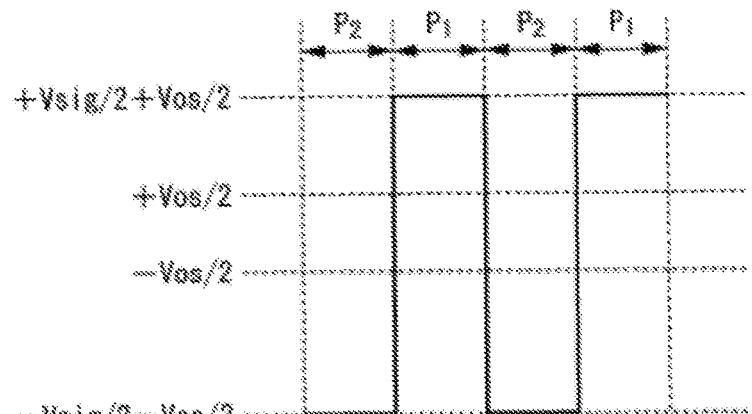
FIG. 4A, FIG. 4B, and FIG. 4C are time charts for illustrating the circuit operation of one of differential amplifiers of the second embodiment.
Figure 4B:
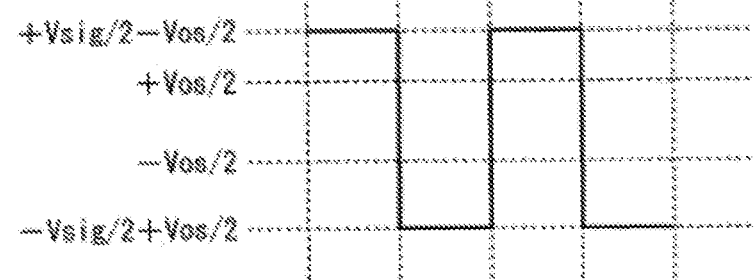
Figure 4C:
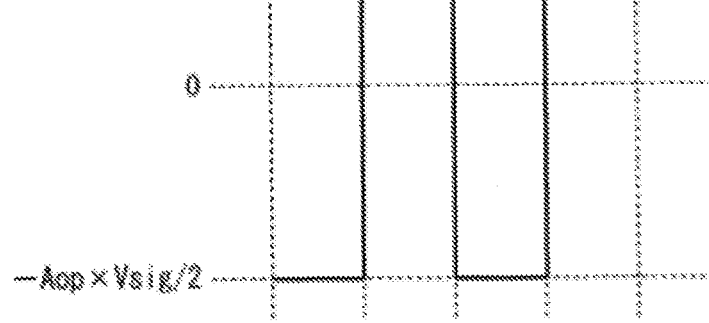

FIG. 4A to FIG. 4C are time charts for illustrating the circuit operation of the differential amplifier 34a of the second embodiment. An example of the first output signals supplied to the differential amplifier 34a and the differential signals output from the differential amplifier 34a is described with reference to FIG. 4A to FIG. 4C.

FIG. 4A is a time chart of the signal S31, which is supplied to the input terminal V39. FIG. 4B is a time chart of the signal S32, which is supplied to the input terminal V40. FIG. 4C is a time chart of the signal S35, which is output from the output terminal VO35.

As illustrated in FIG. 4A to FIG. 4C, in the first phase $P_1$, the Hall element signal $V_{T2}$ expressed by Expression (1) is input to the input terminal V39, and the Hall element signal $V_{T3}$ expressed by Expression (4) is supplied to the input terminal V40. The differential amplifier 34a subtracts the Hall element signal $V_{T3}$ from the Hall element signal $V_{T2}$. The differential amplifier 34a outputs a voltage signal obtained by the subtraction from the output terminal VO35 as the signal S35. Specifically, the differential amplifier 34a inverts the positive/negative sign of the Hall element signal $V_{T3}$. The differential amplifier 34a adds the inverted Hall element signal $V_{T3}$ and the Hall element signal $V_{T2}$.

In the second phase $P_2$, the Hall element signal $V_{T4}$ expressed by Expression (2) is input to the input terminal V39, and the Hall element signal $V_{T1}$ expressed by Expression (3) is supplied to the input terminal V40. The differential amplifier 34a subtracts the Hall element signal $V_{T1}$ from the Hall element signal $V_{T4}$. The differential amplifier 34a outputs a voltage signal obtained by the subtraction from the output terminal VO35 as the signal S35. Specifically, the differential amplifier 34a inverts the positive/negative sign of the Hall element signal $V_{T1}$. The differential amplifier 34a adds the inverted Hall element signal $V_{T1}$ and the Hall element signal $V_{T4}$.

From the output terminal VO36, a signal having a voltage in a phase opposite to the phase of the voltage signal output to the output terminal VO35 is output as the signal S36. In this example, when the first switch circuit 32 is in the first phase, the differential amplifier 34a outputs the signal S35 having a voltage of +Aop×Vsig/2 from the output terminal VO35, and outputs the signal S36 having a voltage of −Aop×Vsig/2 from the output terminal VO36. When the first switch circuit 32 is in the second phase, the differential amplifier 34a outputs the signal S35 having a voltage of −Aop×Vsig/2 from the output terminal VO35, and outputs the signal S36 having a voltage of +Aop×Vsig/2 from the output terminal VO36. The coefficient Aop is the amplification factor of the differential amplifier 34a.

Figure 5A:
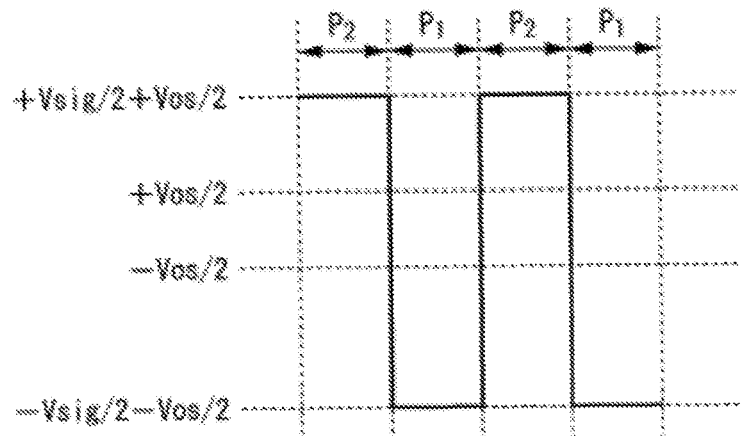
FIG. 5A, FIG. 5B, and FIG. 5C are time charts for illustrating the circuit operation of another of differential amplifiers of the second embodiment.
Figure 5B:
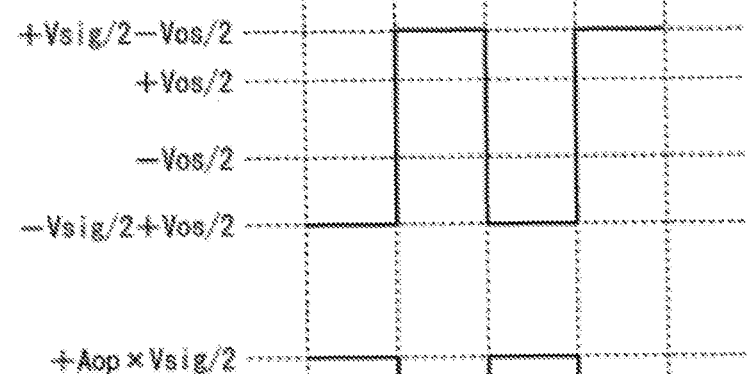
Figure 5C:
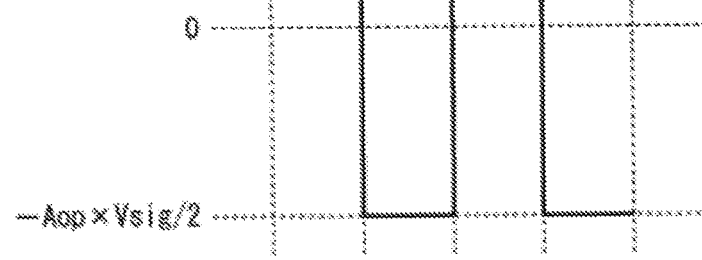

FIG. 5A to FIG. 5C are time charts for illustrating the circuit operation of the differential amplifier 34b of the second embodiment. An example of the first output signals supplied to the differential amplifier 34b and the differential signals output from the differential amplifier 34b is described next with reference to FIG. 5A to FIG. 5C.

FIG. 5A is a time chart of the signal S33, which is supplied to the input terminal V41. FIG. 5B is a time chart of the signal S34, which is supplied to the input terminal V42. FIG. 5C is a time chart of the signal S37, which is output from the output terminal VO37.

As illustrated in FIG. 5A to FIG. 5C, in the first phase $P_1$, the Hall element signal $V_{T4}$ expressed by Expression (2) is input to the input terminal V41, and the Hall element signal $V_{T1}$ expressed by Expression (3) is supplied to the input terminal V42. The differential amplifier 34b subtracts the Hall element signal $V_{T1}$ from the Hall element signal $V_{T4}$. The differential amplifier 34b outputs a voltage signal obtained by the subtraction from the output terminal VO37 as the signal S37. Specifically, the differential amplifier 34b inverts the positive/negative sign of the Hall element signal $V_{T1}$. The differential amplifier 34b adds the inverted Hall element signal $V_{T1}$ and the Hall element signal $V_{T4}$.

In the second phase $P_2$, the Hall element signal $V_{T2}$ expressed by Expression (1) is input to the input terminal V41, and the Hall element signal $V_{T3}$ expressed by Expression (4) is supplied to the input terminal V42. The differential amplifier 34b subtracts the Hall element signal $V_{T3}$ from the Hall element signal $V_{T2}$. The differential amplifier 34b outputs a voltage signal obtained by the subtraction from the output terminal VO37 as the signal S37. Specifically, the differential amplifier 34b inverts the positive/negative sign of the Hall element signal $V_{T3}$. The differential amplifier 34b adds the inverted Hall element signal $V_{T3}$ and the Hall element signal $V_{T2}$.

From the output terminal VO38, a signal having a voltage in a phase opposite to the phase of the voltage signal output from the output terminal VO37 is output as the signal S38. In this example, when the first switch circuit 32 is in the first phase $P_1$, the differential amplifier 34b outputs the signal S37 having a voltage of −Aop×Vsig/2 from the output terminal VO37, and outputs the signal S38 having a voltage of +Aop×Vsig/2 from the output terminal VO38. When the first switch circuit 32 is in the second phase $P_2$, the differential amplifier 34b outputs the signal S37 having a voltage of +Aop×Vsig/2 from the output terminal VO37, and outputs the signal S38 having a voltage of −Aop×Vsig/2 from the output terminal VO38. The coefficient Aop is the amplification factor of the differential amplifier 34b.

The operation of the subtracter 36 is described next. The subtracter 36 performs subtraction on the signal S35 supplied from the input terminal V43 and the signal S37 supplied from the input terminal V45. The signal S35 supplied from the input terminal V43 and the signal S37 supplied from the input terminal V45 are signals having an opposite phase.

The subtracter 36 performs subtraction also on the signal S36 supplied from the input terminal V44 and the signal S38 supplied from the input terminal V46. The signal S36 supplied from the input terminal V44 and the signal S38 supplied from the input terminal V46 are signals having an opposite phase.

In other words, the subtracter 36 outputs signals in which signal components are enhanced. A signal S39 and a signal S40, which are output from the subtracter 36, are an example of the second output signals.

The circuit operation of the second switch circuit 35 is described next. The second switch circuit 35 switches destinations to which the signal S39 supplied from the input terminal V47 and the signal S40 supplied from the input terminal V48 are output, depending on to which signal type the first switch circuit 32 switches. Specifically, the second switch circuit 35 switches signals for output, in synchronization with the operation performed by the first switch circuit 32 to select signals.

More specifically, when the first switch circuit 32 is in the first phase $P_1$, the second switch circuit 35 puts the second switch 35a and the second switch 35d each in a conducting state. The second switch circuit 35 also puts the second switch 35b and the second switch 35c each in a non-conducting state. In this case, the signal S39 supplied from the input terminal V47 is output from the output terminal VO41, and the signal S40 supplied from the input terminal V48 is output from the output terminal VO42.

When the first switch circuit 32 is in the second phase $P_2$, the second switch circuit 35 puts the second switch 5b and the second switch 5c each in the conducting state. The second switch circuit 35 also puts the second switch 5a and the second switch 5d each in the non-conducting state. In this case, the signal S40 supplied from the input terminal V48 is output from the output terminal VO41, and the signal S39 supplied from the input terminal V47 is output from the output terminal VO42.

Third Embodiment

Figure 6:
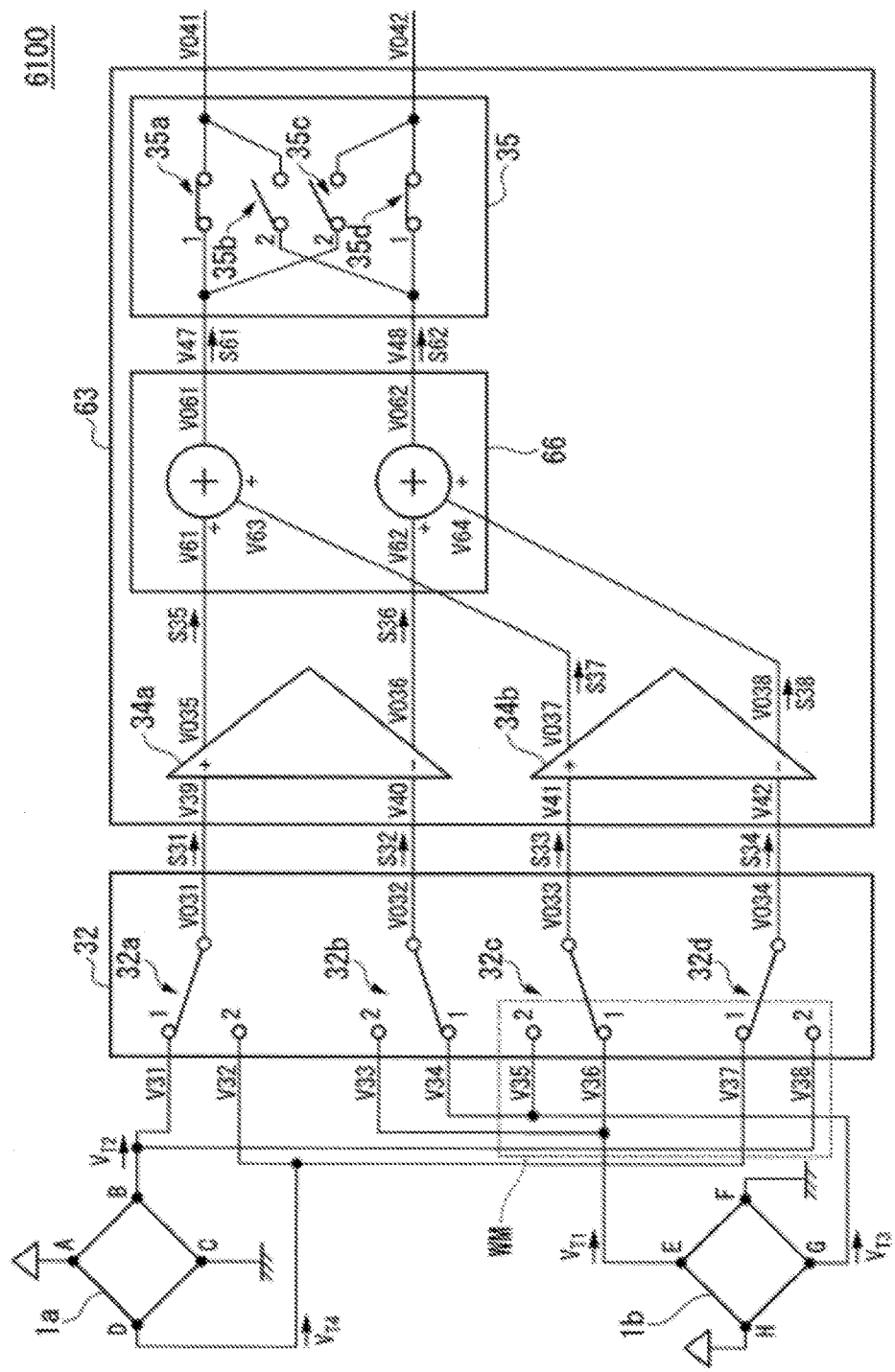
FIG. 6 is a circuit diagram of a magnetic sensor circuit according to a third embodiment of the present invention.

FIG. 6 is a circuit diagram of a magnetic sensor circuit according to the third embodiment.

A magnetic sensor circuit in which an adder is included in a signal processing circuit is described with reference to FIG. 6 and FIG. 7A to FIG. 7C. In a third embodiment of the present invention, components and operation that are the same as those in the first and second embodiments described above are denoted by the same reference symbols, and descriptions on the same components and operation are omitted.

A magnetic sensor circuit 6100 differs from the magnetic sensor circuit 3100 described above in an area enclosed by a broken line WM, in which the Hall element 1a and the Hall element 1b are connected to a part of the first switch circuit 32. The magnetic sensor circuit 6100 includes a signal processing circuit 63, which includes an adder 66. The adder 66 adds signals supplied from the differential amplifier 34a and the differential amplifier 34b.

The input terminal V35 of the first switch 32c is connected to the terminal G of the Hall element 1b. The input terminal V36 of the first switch 32c is connected to the terminal E of the Hall element 1b.

The input terminal V37 of the first switch 32d is connected to the terminal D of the Hall element 1a. The input terminal V38 of the first switch 32d is connected to the terminal B of the Hall element 1a.

The adder 66 includes an input terminal V61, an input terminal V62, an input terminal V63, an input terminal V64, an output terminal VO61, and an output terminal VO62.

The output terminal VO35 of the differential amplifier 34a is connected to the input terminal V61 of the adder 66. The output terminal VO36 of the differential amplifier 34a is connected to the input terminal V62 of the adder 66.

The output terminal VO37 of the differential amplifier 34b is connected to the input terminal V63 of the adder 66. The output terminal VO38 of the differential amplifier 34b is connected to the input terminal V64 of the adder 66.

The output terminal VO61 of the adder 66 is connected to the input terminal V47 of the second switch circuit 35.

The output terminal VO62 of the adder 66 is connected to the input terminal V48 of the second switch circuit 35.

[Outline of the Operation of the Magnetic Sensor Circuit 6100]

The operation of the magnetic sensor circuit 6100 is described next.

A case in which the first switch circuit 32 is in the first phase is described.

The first switch 32c selects the Hall element signal $V_{T1}$ supplied from the input terminal V36. The first switch 32d selects the Hall element signal $V_{T4}$ supplied from the input terminal V37.

A case in which the first switch circuit 32 is in the second phase is described next.

The first switch 32c selects the Hall element signal $V_{T3}$ supplied from the input terminal V35. The first switch 32d selects the Hall element signal $V_{T2}$ supplied from the input terminal V38.

An example of the first output signals supplied to the differential amplifier 34b and the differential signals output from the differential amplifier 34b is described with reference to FIG. 7A to FIG. 7C. The signals input to and output from the differential amplifier 34a are the same as signals input to and output from the differential amplifier 34a in FIG. 4A to FIG. 4C.

Figure 7A:
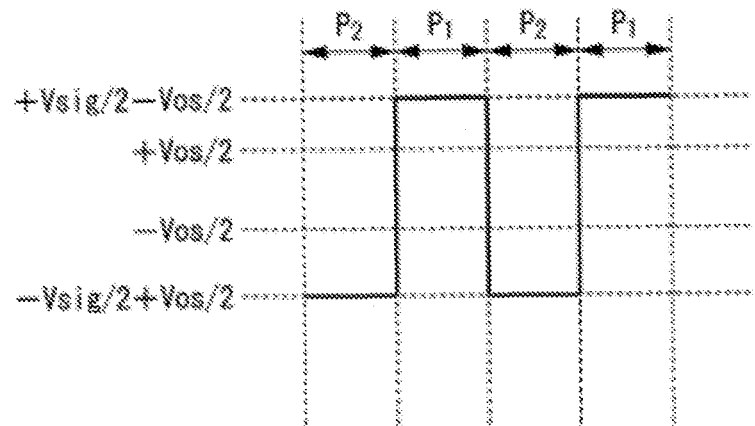
FIG. 7A, FIG. 7B, and FIG. 7C are time charts for illustrating the circuit operation of one of differential amplifiers of the third embodiment.
Figure 7B:
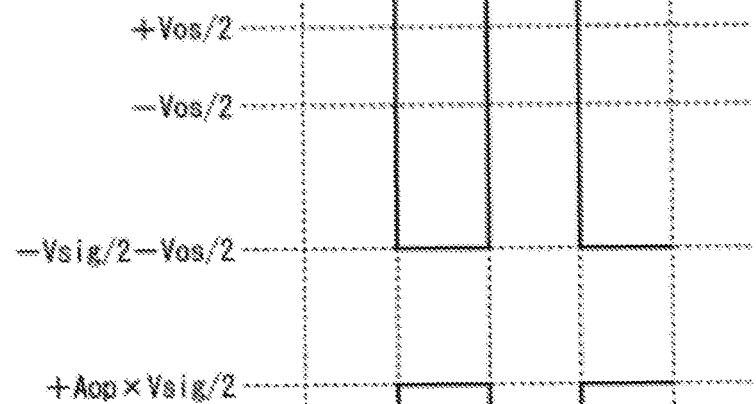
Figure 7C:
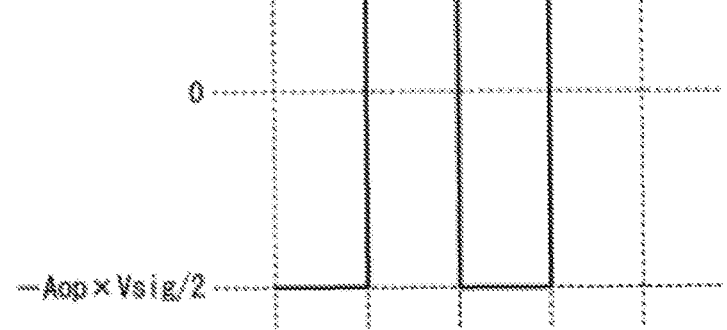
Figure 8:
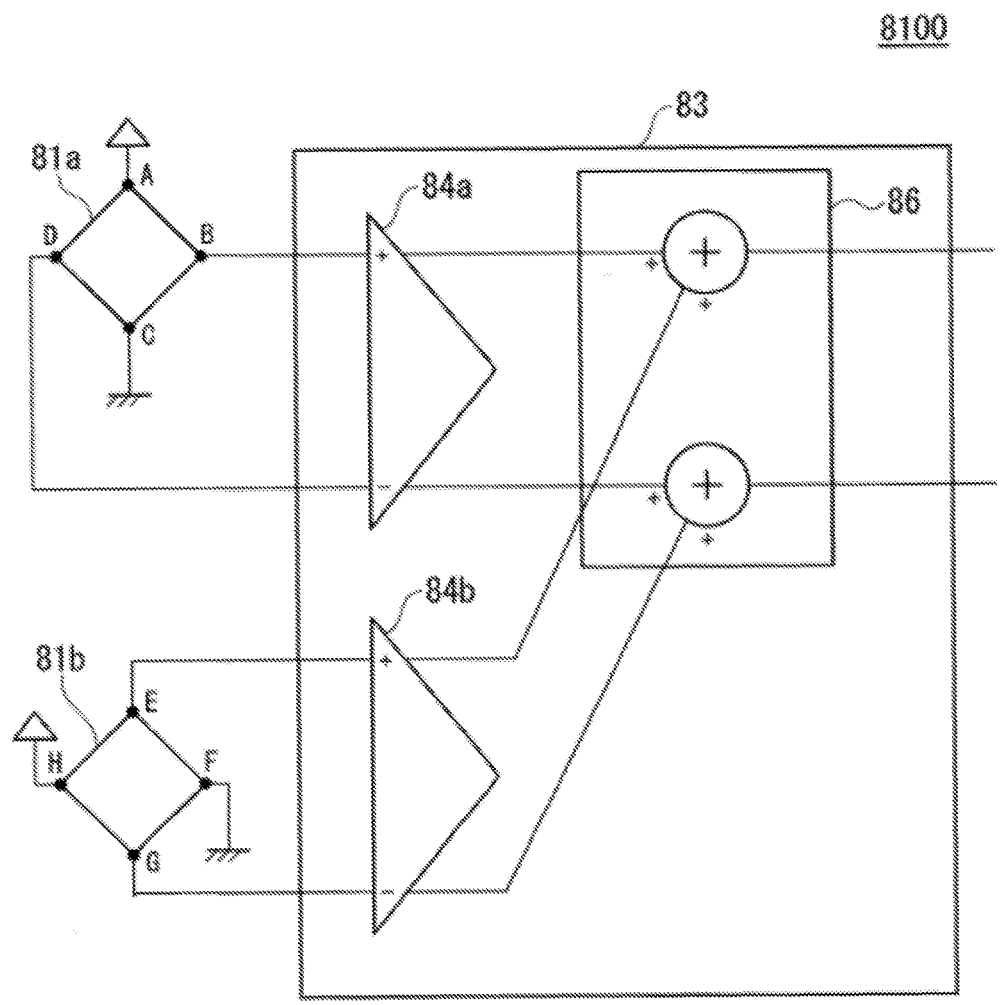
FIG. 8 is a circuit diagram of a magnetic sensor circuit of the related art.

FIG. 7A to FIG. 7C are time charts for illustrating the circuit operation of the differential amplifier 34b of the third embodiment.

FIG. 7A is a time chart of the Hall element signal supplied to the input terminal V41. FIG. 7B is a time chart of the Hall element signal supplied to the input terminal V42. FIG. 7C is a time chart of the voltage signal output from the output terminal VO37.

As illustrated in FIG. 7A to FIG. 7C, in the first phase $P_1$, the Hall element signal $V_{T1}$ expressed by Expression (3) is input to the input terminal V41, and the Hall element signal $V_{T4}$ expressed by Expression (2) is supplied to the input terminal V42. The differential amplifier 34b subtracts the Hall element signal $V_{T4}$ from the Hall element signal $V_{T1}$. The differential amplifier 34b outputs a voltage signal obtained by the subtraction from the output terminal VO37 as the signal S37. Specifically, the differential amplifier 34b inverts the positive/negative sign of the Hall element signal $V_{T4}$. The differential amplifier 34b adds the inverted Hall element signal $V_{T4}$ and the Hall element signal $V_{T1}$.

In the second phase $P_2$, the Hall element signal $V_{T3}$ expressed by Expression (4) is input to the input terminal V41, and the Hall element signal $V_{T2}$ expressed by Expression (1) is supplied to the input terminal V42. The differential amplifier 34b subtracts the Hall element signal $V_{T3}$ from the Hall element signal $V_{T2}$. The differential amplifier 34b outputs a voltage signal obtained by the subtraction from the output terminal VO37 as the signal S37. Specifically, the differential amplifier 34b inverts the positive/negative sign of the Hall element signal $V_{T3}$. The differential amplifier 34b adds the inverted Hall element signal $V_{T3}$ and the Hall element signal $V_{T2}$.

From the output terminal VO38, a signal having a voltage in a phase opposite to the phase of the voltage signal output from the output terminal VO37 is output as the signal S38. In this example, when the first switch circuit 32 is in the first phase $P_1$, the differential amplifier 34b outputs the signal S37 having a voltage of +Aop×Vsig/2 from the output terminal VO37, and outputs the signal S38 having a voltage of −Aop×Vsig/2 from the output terminal VO38. When the first switch circuit 32 is in the second phase $P_2$, the differential amplifier 34b outputs the signal S37 having a voltage of −Aop×Vsig/2 from the output terminal VO37, and outputs the signal S38 having a voltage of +Aop×Vsig/2 from the output terminal VO38. The coefficient Aop is the amplification factor of the differential amplifier 34b.

The operation of the adder 66 is described next. The adder 66 adds the signal S35 supplied from the input terminal V61 and the signal S37 supplied from the input terminal V63. The signal S35 supplied from the input terminal V61 and the signal S37 supplied from the input terminal V63 are voltage signals having a voltage in the same phase as each other. The adder 66 outputs a voltage signal obtained by the addition from the output terminal VO61 as a signal S61. The signal S61 is supplied to the input terminal V47 of the second switch circuit 35.

The adder 66 also adds the signal S36 supplied from the input terminal V62 and the signal S38 supplied from the input terminal V64. The signal S36 supplied from the input terminal V62 and the signal S38 supplied from the input terminal V64 are voltage signals having a voltage in the same phase as each other. The adder 66 outputs a voltage signal obtained by the addition from the output terminal VO62 as a signal S62. The signal S62 is supplied to the input terminal V48 of the second switch circuit 35.

In other words, the adder 66 outputs the signal S61 and the signal S62 in which signal components are enhanced. The signal S61 and the signal S62 are an example of the second output signals.

To summarize the description given above, the magnetic sensor circuit 3100 according to the second embodiment and the magnetic sensor circuit 6100 according to the third embodiment construct the chopping circuit from the Hall element 1a, the Hall element 1b, and the first switch circuit 32. The first switch circuit 32 selects a combination of Hall element signals with which respective offset components are reduced, from among four Hall element signals output by the Hall element 1a and the Hall element 1b. The magnetic sensor circuit 3100 and the magnetic sensor circuit 6100 can utilize all Hall element signals output from the Hall elements. In other words, the magnetic sensor circuit 3100 and the magnetic sensor circuit 6100 can raise the utilization efficiency of electric power used to detect the magnetic field intensity or the magnetic flux density from the utilization efficiency in the magnetic sensor circuit 100.

The embodiments of the present invention and the variations thereof have been described above. However, those embodiments and variations are presented as examples and are not intended to limit the scope of the invention. Those embodiments and variations may be implemented in other various modes, and various kinds of omissions, replacements, and modifications can be made without departing from the gist of the invention. Those embodiments and variations are included in the scope and gist of the invention, and are also included in the invention described in the appended claims and the scope of their equivalents. The embodiments and variations described above can be combined with one another to suit individual cases.

What is claimed is:

1. A magnetic sensor circuit configured to output a signal according to an intensity of a magnetic field applied to a Hall element, the magnetic sensor circuit comprising:
   a first Hall element configured to output a first signal and a second signal each having a signal component of an opposite phase and an offset component of an opposite phase;
   a second Hall element configured to output a third signal and a fourth signal each having a signal component of an opposite phase and an offset component of an opposite phase,
      the third signal having the signal component of a same phase with the signal component of the first signal, and having the offset component of an opposite phase with the offset component of the first signal,
      the fourth signal having the signal component of a same phase with the signal component of the second signal, and having the offset component of an opposite phase with the offset component of the second signal;
   a signal switching unit configured to select, among the first signal, the second signal, the third signal, and the fourth signal, at least two different signals as first output signals, by selecting signals each having the signal component of the opposite phase when the offset components each have the same phase, and by selecting signals each having the signal component of the same phase when the offset components each have the opposite phase; and
   a signal processing unit configured to output second output signals in which the offset components of the respective first output signals are reduced by performing calculation between the respective first output signals selected by the signal switching unit.

2. A magnetic sensor circuit according to claim 1, further comprising a second signal switching unit configured to switch destinations to which the second output signals are output, depending on the signal switched by the signal switching unit.

3. A magnetic sensor circuit according to claim 2, wherein the first Hall element, the second Hall element, the signal switching unit, the signal processing unit, and the second signal switching unit are formed on a same semiconductor substrate.

* * * * *